United States Patent [19]
Yamauchi

[11] Patent Number: 5,097,445
[45] Date of Patent: Mar. 17, 1992

[54] SEMICONDUCTOR INTEGRATED CIRCUIT WITH SELECTIVE READ AND WRITE INHIBITING

[75] Inventor: Naoki Yamauchi, Itami, Japan

[73] Assignee: Mitsubishi Denki Kabushiki Kaisha, Tokyo, Japan

[21] Appl. No.: 450,809

[22] Filed: Dec. 14, 1989

[30] Foreign Application Priority Data

Mar. 3, 1989 [JP] Japan ................ 1-52231

[51] Int. Cl.⁵ .......................... G11C 7/00; G06F 7/38; G06F 11/00
[52] U.S. Cl. ........................ 365/195; 365/189.07; 365/228; 364/DIG. 1; 395/425; 395/775
[58] Field of Search .............. 365/189.05, 189.07, 365/195, 185, 228; 235/492; 364/200, 900

[56] References Cited

U.S. PATENT DOCUMENTS

| | | | |
|---|---|---|---|
| 3,573,855 | 4/1971 | Cragon et al. | 364/200 |
| 3,742,458 | 6/1973 | Inoue et al. | 364/200 |
| 4,701,886 | 10/1987 | Sakakibara et al. | 365/189.07 |
| 4,796,232 | 1/1989 | House | 365/230.05 |
| 4,931,997 | 6/1990 | Mitsuishi et al. | 365/195 |
| 4,975,878 | 12/1990 | Boddu et al. | 365/195 |

FOREIGN PATENT DOCUMENTS 58-111197  7/1983  Japan.
59-231800  12/1984  Japan.
62-160554  7/1987  Japan.
63-86049   4/1988  Japan.

OTHER PUBLICATIONS

Motorola 8bit MCU Family Products Guide ('87).

*Primary Examiner*—Joseph A. Popek
*Assistant Examiner*—Jack A. Lane
*Attorney, Agent, or Firm*—Townsend and Townsend

[57] ABSTRACT

A semiconductor integrated circuit with a non-volatile memory capable of electric rewriting of data is disclosed. The circuit is provided with inhibiting means for comparing an address of a write inhibition area of the non-volatile memory and an address from an external or internal CPU and inhibiting the writing of data in the area when the two compared addresses coincide, and also comparing an address of a read inhibition area of the non-volatile memory and an address from an external reader/writer and inhibiting the reading of data from the area when the two compared addresses coincide. It is thus possible to prevent erroneous rewriting of a program or protection-required data due to runaway of CPU and also prevent reading of secret data by a third party. Thus, a microcomputer can be realized, in which a program memory and a data memory both consist of non-volatile memories capable of rewriting of data, and which is very easy to use and has improved reliability and confidential property.

11 Claims, 7 Drawing Sheets

SEMICONDUCTOR INTEGRATED CIRCUIT WITH SELECTIVE READ AND WRITE INHIBITING

BACKGROUND OF THE INVENTION

1. Field of the Invention

This invention relates to a semiconductor integrated circuit, which includes a non-volatile memory capable of electrically re-writing data and used as a main memory of a microcomputer or the like for controlling an apparatus.

2. Description of the Prior Art

Recently, an EEPROM (electrically erasable and programmable read only memory) or like non-volatile memory, which does not require the back-up of the stored data and is capable of electric re-writing of data, is used as part of a main memory of a microcomputer.

Figures 7, 8:
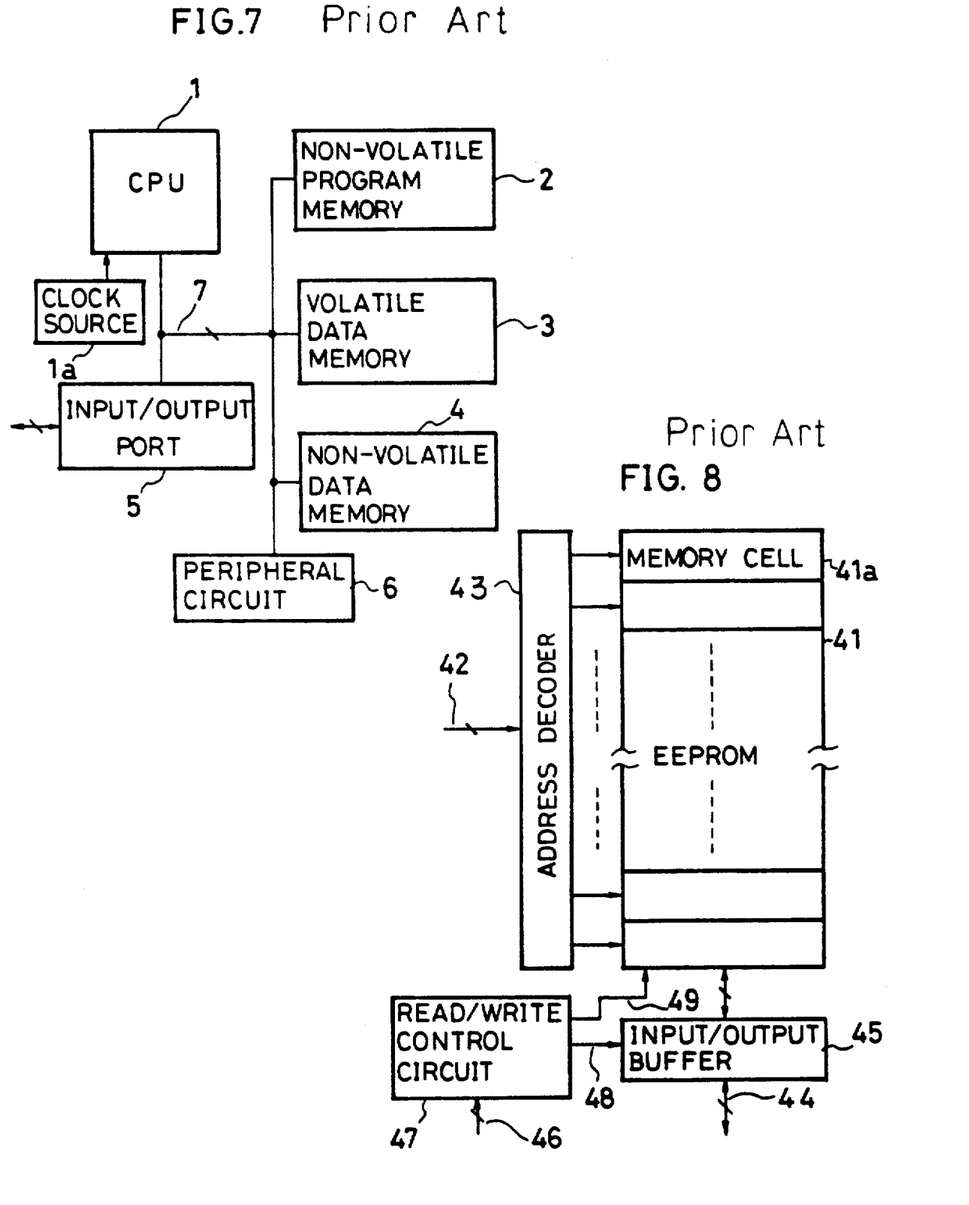
FIGS. 7 and 8 are block diagrams showing respective prior art circuits.

FIG. 7 is a block diagram showing the construction of a prior art microcomputer. Reference numeral 1 designates a CPU (central processing unit) with a clock source 1a, 2 a non-volatile program memory consisting of a masked ROM incapable of electrically re-writing data or an EPROM capable of electrically re-writing data, 3 a volatile data memory consisting of a static RAM or the like capable of re-writing of data, 4 a non-volatile data memory consisting of an EEPROM or the like capable of electrically re-writing data, 5 an input/output port 6, a peripheral circuit such as a timer or a communication interface, and 7 a bus connecting the individual components noted above.

FIG. 8 is a block diagram showing a prior art example of a semiconductor integrated circuit consisting of a single chip provided with the non-volatile data memory 4 and a control circuit therefor or like peripheral circuit. In the Figure, reference numeral 41 designates an EEPROM consisting of an array of memory cells 41a capable of storing, for instance, 8-bit parallel data. The EEPROM has a memory capacity of several kilobytes. Numeral 42 designates an address input from an external reader/writer or CPU 1 for specifying an address of memory cells 41a of the EEPROM 41, 43 an address decoder for decoding the address input 42 and thereby selecting a memory cell 41a, 44 a data input/output terminal, through which read or write data is transferred between the EEPROM 41 and the external reader/writer or CPU 1, 45 an input/output buffer such as a tri-state buffer provided between the data input/output terminal 44 and EEPROM 41 and capable of controlling the output status of data read out from the EEPROM 41, 46 a read/write control signal input from the external reader/writer or CPU 1 for reading or writing data, and 47 a read/write controller for providing a read signal 48 for controlling the input/output buffer 45 or a write signal 49 for controlling a write line of the EEPROM 41 based on the read/write control signal 46.

The operation will now be described.

The CPU 1 reads out and executes predetermined programs from the non-volatile program memory 2. If necessary, it also performs reading or writing of data into or from the volatile or non-volatile data memory 3 or 4 and effects input or output of control data or the like through the input/output port 5. Generally, in the volatile data memory 3 the stored data vanishes when the power source is cut off. Therefore, this memory is used for an operating area of the CPU 1. In the non-volatile data memory 4, on the other hand, the stored data does not vanish even when the power source is cut off. In this memory, therefore, data requiring protection or secret data such as user's secret code is stored. The non-volatile data memory 4 is capable of reading or writing of data under control of the external reader/writer on CPU 1. This operation will be described with reference to FIG. 8.

When writing data, write data is provided from the external reader/writer or CPU 1 through the data input/output terminal and input/output buffer 45 to the EEPROM 41. Also, the address input 42 provided from the external reader/writer or CPU 1 is decoded by the address decoder 43 to select a particular row of memory cells 41a. Further, according to the read/write control signal input 46 from the external reader/writer or CPU 1, the read/write controller 47 generates a write signal 49 for the selected row of memory cells 41a, whereby data is written in a corresponding memory cell 41a.

When reading data, according to the address input 42 from the external reader/writer or CPU 1 data stored in the memory cell 41a in the row selected by the address decoder 43 is read out to be provided through an input/output buffer 45 to the external reader/writer or CPU 1. At this time, the output state of the input/output buffer 45 is controlled according to the read signal 48 from the read/write controller 47.

In the above way, data is written into or read out from a given address of the EEPROM 41.

With the above construction of the prior art semiconductor integrated circuit, data from the external reader/writer or CPU 1 can be freely written into the non-volatile data memory 4. This means that it is possible to let the external reader/writer read out a secret code or like secrete data. Therefore, it is difficult to prevent leakage of secret data to the third party. Further, a runaway of the CPU 1 due to an external disturbance or program inadequacy will permit re-writing of data requiring protection. Further, since the program memory 2 consists of a masked ROM or PROM, a program can not be readily re-writing when it is necessary to effect re-writing. To solve this problem, it is conceivable to construct the program memory with a non-volatile memory capable of re-writing of data. In this case, however, although it is possible to freely re-write data, a program is liable to be re-written due to a runaway of the CPU like the data requiring protection noted above.

SUMMARY OF THE INVENTION

This invention is intended to solve the above problems, and its object is to provide a semiconductor integrated circuit, which can prevent erroneous re-writing of a program or data requiring protection due to a runaway of the CPU as well as preventing the reading of secret data by the third party.

According to the invention, there is provided a semiconductor integrated circuit, which comprises inhibiting means which, when an address of a write inhibition area of a non-volatile memory capable of electrically re-writing data is set and coincides with an address provided from a CPU, inhibits the writing data in that write inhibition area and, when an address of a read inhibition area of the non-volatile memory is set and coincides with an address provided from an external reader/writer, inhibits the reading of data from that read inhibition area.

Thus, with the setting of an address of a program area or data area requiring protection as a write inhibition area in the inhibiting means, only the re-writing by the CPU is inhibited while permitting ordinary reading of programs and data requiring protection from the CPU and writing of data from an external reader/writer. Thus, it is possible to prevent erroneous writing of data due to runaway of the CPU. In addition, with the setting of an address of a secret data area as read inhibition area in the inhibiting means, only the reading of data by the external reader/writer is inhibited while permitting the ordinary writing and reading of data by the CPU and writing of data by the external reader/writer. It is thus possible to prevent leakage of secret data to the third party.

The above and other objects, features and advantages of the invention will become more apparent from the following description when taken in conjunction with the accompanying drawings.

DESCRIPTION OF THE PREFERRED EMBODIMENTS

Now, preferred embodiments of the invention will be described with reference to the drawings. Parts like those shown in FIGS. 7 and 8 are designated by like reference numerals with omission of their description.

Figure 1:
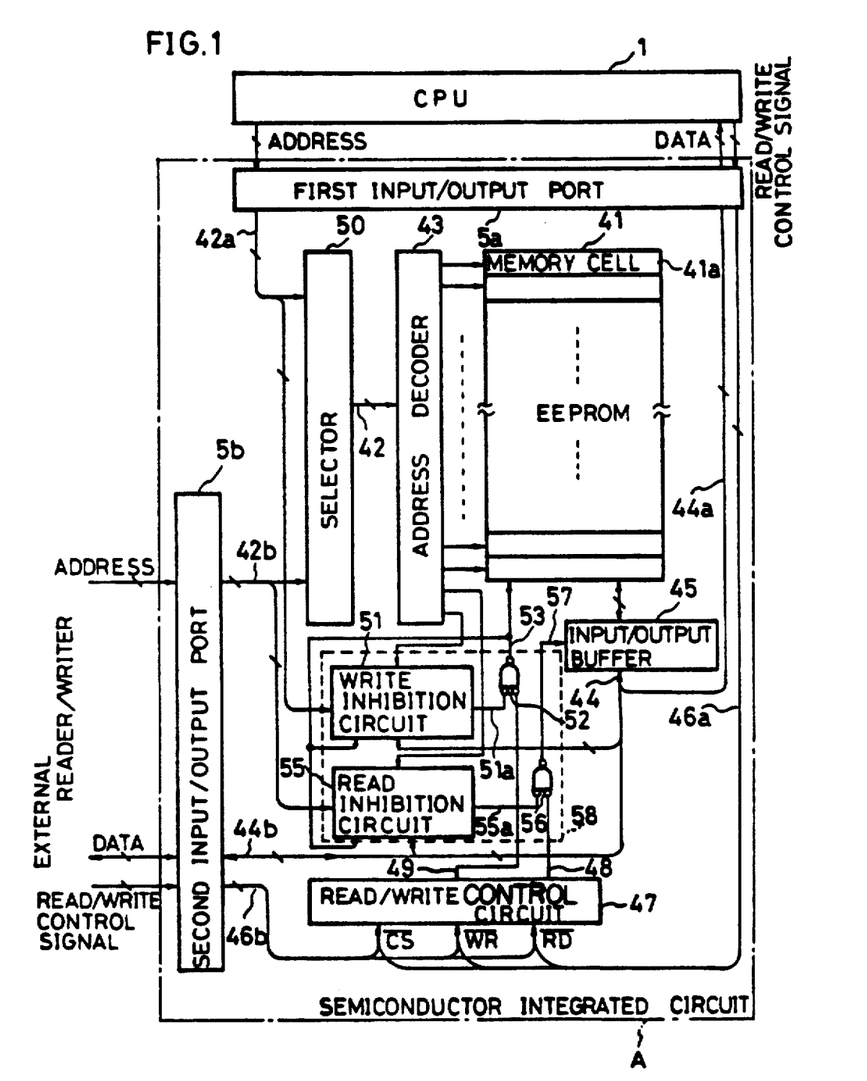
FIG. 1 is a block diagram showing a first embodiment of the invention.

FIG. 1 is a block diagram showing a first embodiment of the invention. A clock source 1a and a peripheral circuit 6 shown in FIG. 7 are not shown. In the Figure, designated at 5a is a first input/output port, to which address bus, data bus and read/write control signal bus from an external CPU 1 are connected, 5b a second input/output port, to which address bus, data bus and read/write control signal bus from an external reader/writer are connected, 50 a selector, which supplies an address input 42a, from the external CPU 1 through the first input/output port 5a or an address input 42b from the external reader/writer through the second input/output port 5b as address input 42 to an address decoder 43. Read/write control signal inputs 46a and 46b from the external CPU 1 and external reader/writer consists of a read signal $\overline{RD}$, a write signal $\overline{WR}$ and a chip selection signal $\overline{CS}$, which are negative signals, and are supplied to a read/write control circuit 47. Further, data input/output lines 44a and 44b are connected to an input/output buffer 45. Designated at 51 is a write inhibition circuit, which compares upper bits of an address of a preset write inhibition area in an EEPROM 41 and like upper bits of the address input 42a from the external CPU 1 and, when these upper bits coincide, provides a write inhibition output 51a at logic "H" Level, 52 a negative logic AND gate, to which the write inhibition output 51a and a write signal 49 from the read/write control circuit 47 are supplied, 53 a write signal supplied from the AND gate 52 to a write line of the EEPROM 41, 55 a read inhibition circuit, which compares upper bits of an address of a present write inhibition area in the EEPROM 41 and like upper bits of the address input 42b from the external reader/writer and, when these bits coincide, provides a read inhibition signal 55a at "H" level, 56 a negative logic AND gate, to which the read inhibition signal 55a and a read signal 48 from the read/write control circuit 47 are supplied, and 57 a read signal supplied from the AND gate 56 to the input/output buffer 45. The write and read inhibition circuits 51 and 55 and AND gates 52 and 56 constitute inhibiting means 58 according to the invention. The first and second input/output ports 5a and 5b and various components from the large capacity EEPROM 41 to inhibiting means 58 are formed on one chip and constitute a semiconductor integrated circuit A. To the inhibition circuits 51 and 55 are supplied, in addition to the upper bits of the address inputs 42a and 42b noted above and for the purpose of setting inhibition area data, a selection line from the address decoder 43, setting data from data input/output line 44, and the write signal 53 from the AND gate 52.

Figure 2A:
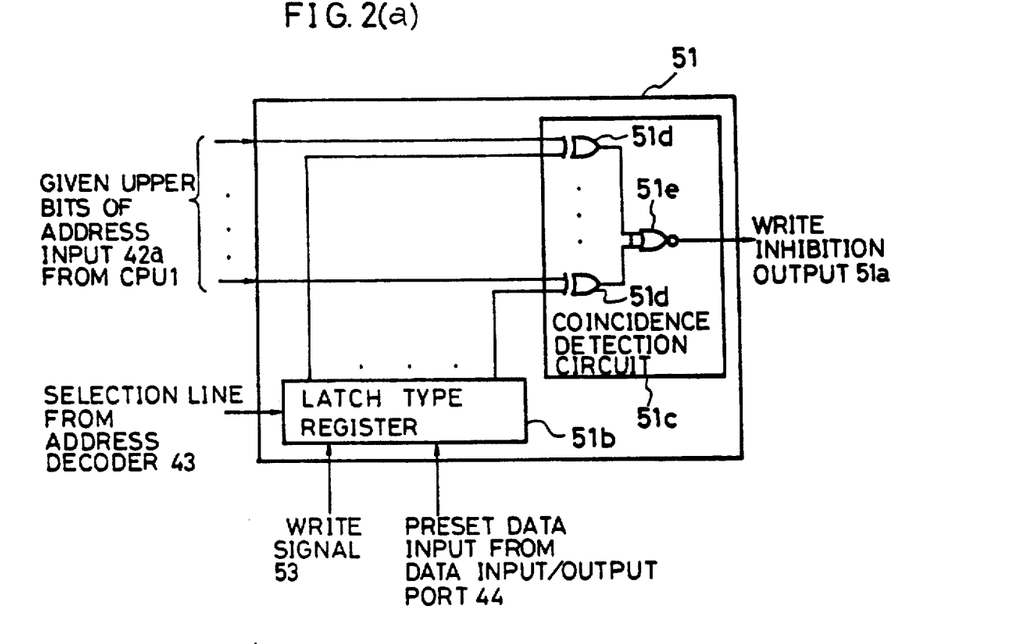
FIGS. 2(a) and 2(b) are circuit diagrams showing the internal construction of a write inhibition circuit and a read inhibition circuit of the embodiment.
Figure 2B:
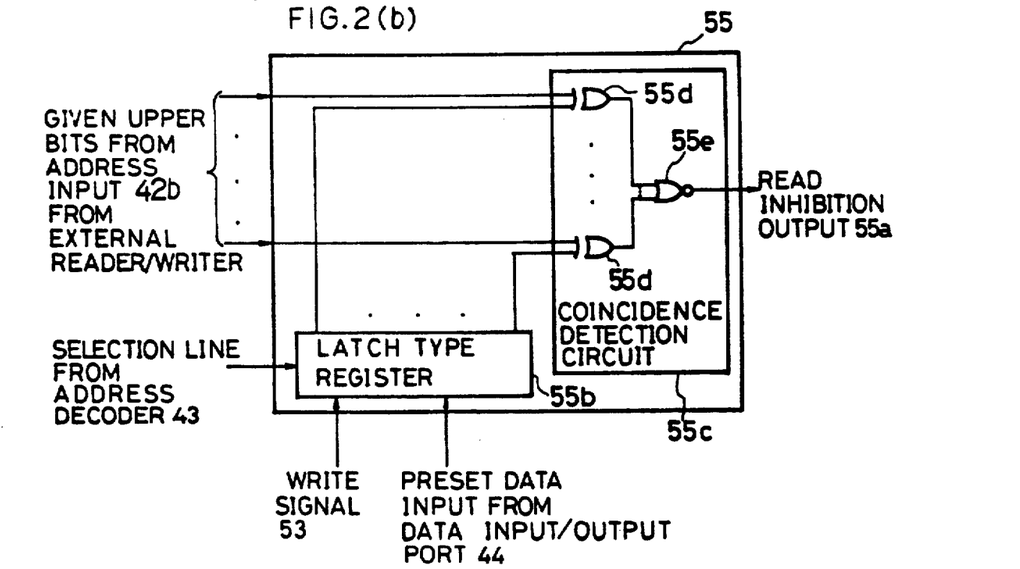

FIGS. 2(a) and 2(b) are circuit diagrams showing internal circuit constructions of the write and read inhibition circuits 51 and 55. The inhibition circuits 51 and 55 each include a latch type register 51b or 55b of given bits, to which are supplied signal on the selection line from the address decoder 43, the write signal 53 and setting data from the data input/output line 44, and a coincidence detection circuit 51c or 55c, which compares given upper bits of the address input 42a or 42b from the CPU 1 or external reader/writer and the output of the latch type register 51b or 55b and, when these data coincide, provides an inhibition output 51a, or 55a at logic "H" level. The coincidence detection circuits 51c and 55c each include an exclusive OR gate 51d or 55d of several bits, to which the address input 42a or 42b and a corresponding bit value of the latch type register 51b or 55b are supplied, and a NOR gate 51e or 55e, which receives the output of the exclusive OR gate 51d or 55d and provides the inhibition output 51a and 55a.

Figure 3A:
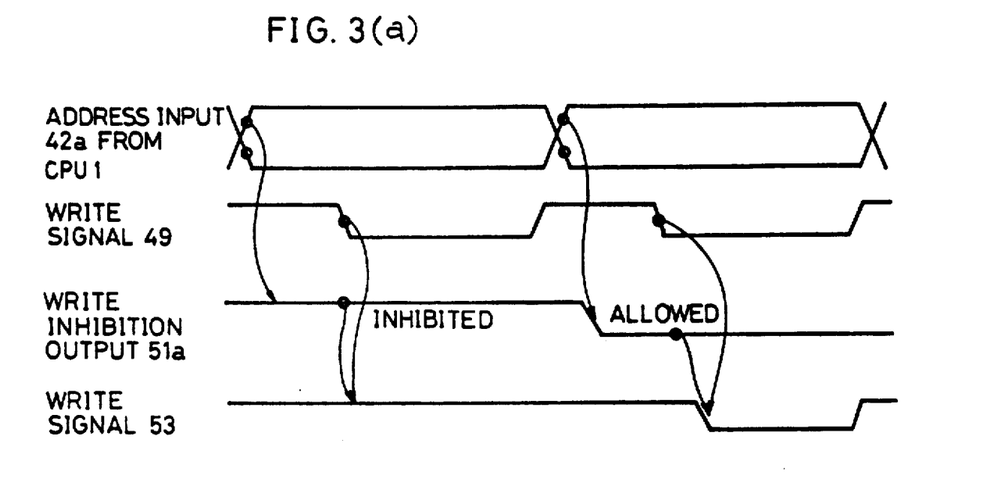
FIGS. 3(a) and 3(b) are timing charts illustrating the operation of the embodiment at the time of writing data and at the time of reading data, respectively.
Figure 3B:
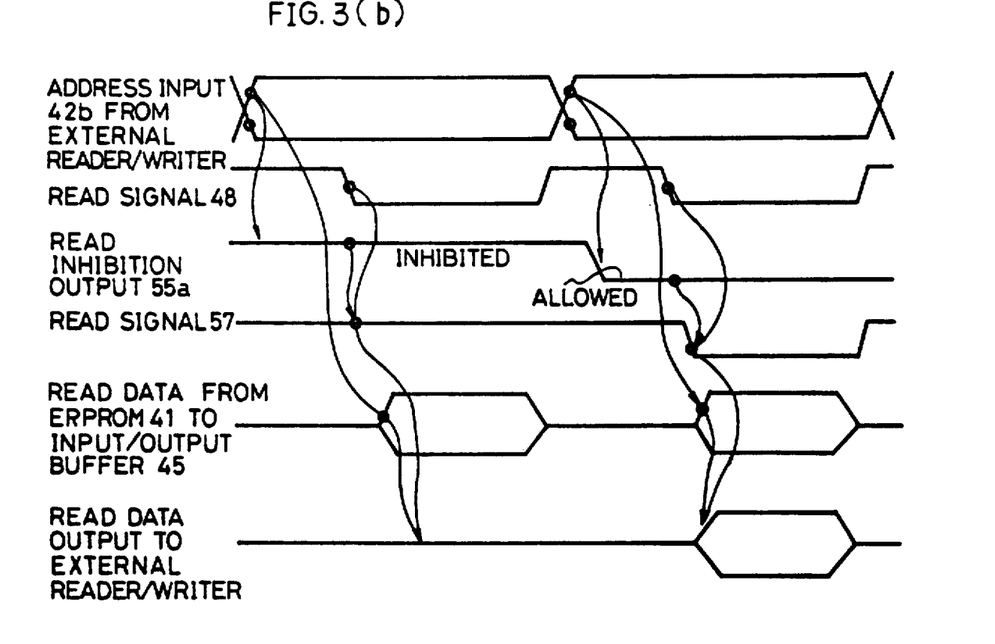

FIGS. 3(a) and 3(b) are timing charts illustrating the operation of this embodiment. FIG. 3(a) shows the operation at the time of writing, and FIG. 3(b) shows the operation at the time of reading.

The operation will now be described.

In the first place, when power source is connected, the CPU 1 reads out a predetermined program from a program area of the EEPROM 41 and executes the program. At this time, with a command written in advance at the outset of the program, the command being for setting desired write and read inhibition areas, given upper bits of the addresses of the inhibition areas can be set in the latch type registers 51b and 55b of the write and read inhibition circuits 51 and 55 when the program is executed. Now, operations at the time of writing data and at the time of reading data will be described with reference to the timing chart of FIG. 3.

At the time of writing data, write data is supplied from the external reader/writer or the CPU 1 through the first or second input/output port 5a or 5b, the data input/output line 44a or 44b and the input/output buffer 45 to the EEPROM 41. Further, the address input data 42a or 42b supplied from the external reader/writer or the CPU 1 through the first or second input/output port 5a or 5b is supplied through the selector 50 to the address decoder 43 to be decoded to select a memory cell 41a in a particular row. Further, according to a read-/write control signal input 46a or 46b similarly supplied from the external reader/writer or the CPU 1, the read/write control circuit 47 generates a write signal 49 for writing data in the row of the selected memory cell 41a. At this time, if data showing a write inhibition area has been set in the latch type register 51b of the write inhibition circuit 51 from the CPU 1, with the selection of the row of memory cell 41a in the pertinent inhibition area according to the address input 41a from the CPU 1 given upper bits of the address input 42a are supplied to the write inhibition circuit 51 to check whether these bits coincide with the setting data in the latch type registers 51b. If the data coincide, the write inhibition output 51a is provided as logic "H" level signal. As a result, the write signal 49 from the read/write control circuit 47 is blocked by the AND gate 52, and the signal 53 for writing data in the EEPROM 41 is not effective. Thus, no data is written. It will be understood that by setting a program area or data area requiring protection to be a write inhibition area it is possible to prevent erroneous writing of data due to runaway of the CPU 1, while permitting of data in other areas from the CPU 1 and also writing of data in all the areas from the external reader/writer.

At the time of reading data, according to the address input data 42a or 42b similarly supplied from the external reader/writer or the CPU 1 data stored in the memory cell 41a of the selected row selected in the address decoder 43 through the selector 50 is read out and supplied to the input/output buffer 45. Further, a read signal 48 is produced from the read/write control circuit 47 according to a read timing of the similarly supplied read/write control signal 46a or 46b. At this time, in case of a read data request from the external reader/writer, if data showing a read inhibition area is set in the latch type register 55b of the read inhibition circuit 55, given upper bits of the address input 42b from the external reader-writer are supplied to the read inhibition circuit 55 with the selection of the row of memory cell 41a in the pertinent inhibition area according to the address input 42b and are checked for coincidence with the setting data in the latch type register 55b. If the coincidence is detected, the read inhibition output 55a is provided as logic "H" level signal. The read signal 48 from the read/write control circuit 47 is blocked by the AND gate 56, and the read signal 57 to the input/output buffer 45 is ineffective. Thus, no data is provided to the external reader/writer. Thus, by setting a secret data area as a read inhibition area, the reading of data in the pertinent area by the external reader/writer can be inhibited to prevent reading of secret data by a third party, while permitting the reading of data from other areas by the external reader/writer and reading of data from all the areas by the CPU 1.

Figure 4:
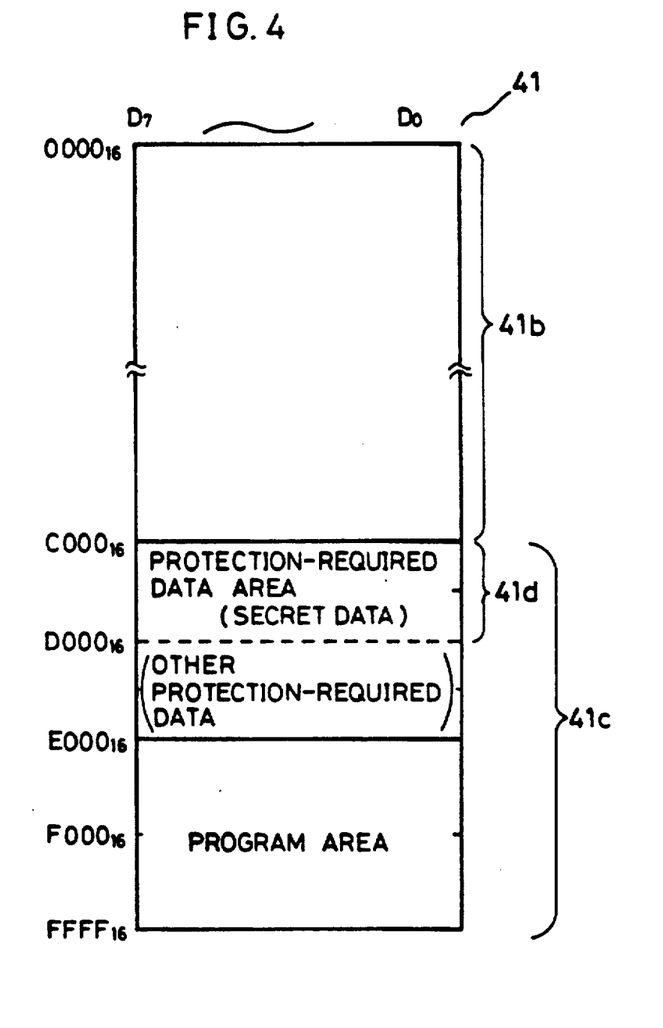
FIG. 4 is a view showing an example of setting of an inhibition area.

An example of setting of the inhibition area will be described with reference to FIG. 4. In the illustrated example, the EEPROM 41 has a capacity of 64 kbytes (with addresses "0000" to "FFFF"). An area 41b is capable of writing and reading data in and out of it. This area is used as an operating area of the CPU 1 or an ordinary data area. An area 41c is a write inhibition area. This area may be used as a program area or a protection-required data area required when executing a program. An area 41d contained in the protection-required data area in the write inhibition area 41c is a read inhibition area. Among protection-required data, such secret data as ciphers or individual registration numbers are stored in this area. Addresses in a range of "C000" to "FFFF" are allotted to the write inhibition area 41c. The upper two bits of address area all "11", and hence "11" are set as inhibition area data in the latch type register 51b of the write inhibition circuit 51. The upper two bits of the address input 42a are thus supplied from the CPU 1 to check for coincidence. Addresses in a range of "C000" to "CFFF" are allotted to the read calibration area 41d. The upper four bits of address are all "1100", and hence data "1100" is set as inhibition area data in the latch type register 55b of the read inhibition area 55. The four upper bits of the address input 42b are supplied from the external reader/writer for checking for coincidence. The setting data noted above can be written with designation of a selection line of the latch type register 51b or 55b through the address decoder 43 according to the address input 42a or 42b from the CPU 1 or external reader/writer, provision of the setting data from the CPU 1 or external reader/writer and providing the write signal 53 through the read/write control circuit 47 and AND gate 52 according to the read/write control signal input 46a or 46b. Usually, this data is written automatically at the commencement of program execution after closure of the power source as noted above. When addresses "DFFE" and "DFFF", for instance, of the write inhibition area 41c shown in FIG. 4 are allotted as the addresses of the latch type registers 51b and 55b, the writing of data from the CPU 1 is inhibited right after the writing of the setting data. Thus, there is no possibility of rewriting of the setting data even in the case when the address of the latch type register 51b or 55b is designated due to runaway of the CPU 1. Conversely, when the addresses of the latch type registers 51b and 55b are allotted to the area 41b capable of reading and writing data, it is possible to permit rewriting of the setting data, if necessary, for rewriting a program or protection-requiring data.

Figure 5:
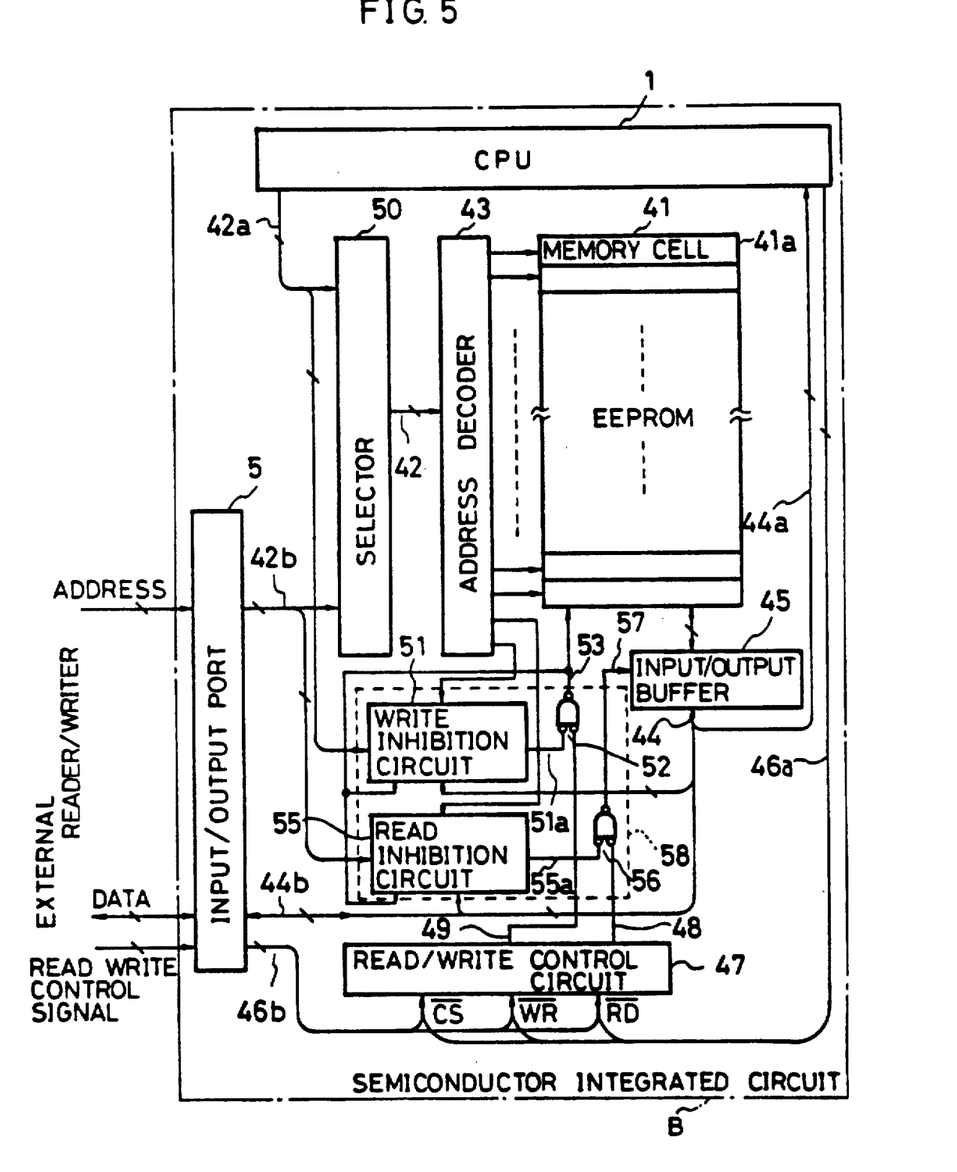
FIG. 5 is a block diagram showing a second embodiment of the invention.

FIG. 5 is a block diagram showing a second embodiment. This embodiment is a semiconductor integrated circuit B realizing a one-chip microcomputer, which includes CPU 1, and in which both program memory and data memory are constituted by EEPROM 41. Like the embodiment shown in FIG. 1, the clock source 1a of the CPU 1 and such peripheral circuit 6 as timers and communication interfaces are not shown. As shown in the Figure, this embodiment is free from the first input/output port 5a provided in the first embodiment for connection of the external CPU 1 but is provided with a sole input/output 5 for the external reader/writer. The address input 42a of the internal CPU 1 and data input/output 44a are not taken out to the outside. The effect of inhibition of the reading of secret data thus can be enhanced. This embodiment can be realized by constructing the CPU 1 and peripheral circuit with CMOS (complementary metal oxide semiconductor), constructing the EEPROM 41 with MNOS (metal nitride oxide semiconductor) and mounting these circuits on a single silicon chip. By so doing, the yield can be improved.

Figure 6:
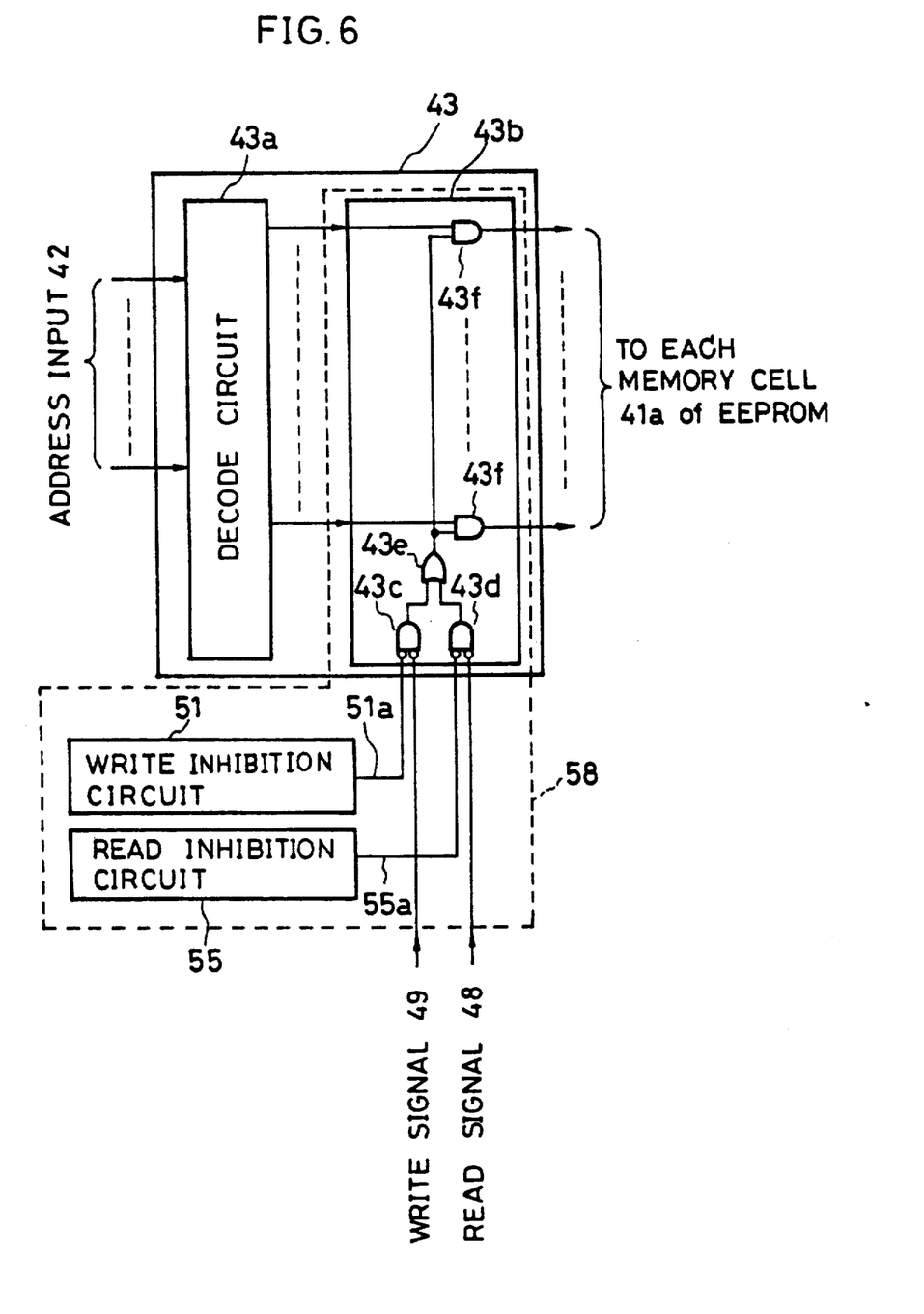
FIG. 6 is a schematic showing a further embodiment of the invention.

In the above embodiment the write line of the EEPROM 41 and input/output buffer 45 are controlled by controlling the write and read signals 49 and 48 from the read/write control circuit 47 according to the inhibition outputs 51a and 55a from the write and read inhibition circuits 51 and 55, but the same effects can also be obtained by controlling the output of the address decoder 43 according to the inhibition outputs 51a and 55a and write and read signals 49 and 48. More particularly, as shown in FIG. 6, it is possible to construct the address decoder 43 with a decoding circuit 43a and a decoded output inhibition circuit 43b, construct the decoded output inhibition circuit 43b with a NAND gate 43c of negative logic receiving the write inhibition output 51a and write signal 49, a NAND gate 43d of negative logic receiving the read inhibition output 55a and read signal 48, an OR gate 43e receiving the outputs of the NAND gates 43c and 43d and NAND gates 43f corresponding in number to the number of the output bits of the decoding circuit 43a and each receiving each bit of the decoding circuit output and the output of the OR gate 43e and supply the outputs of the AND gates 43f to respective selection lines for selecting memory cells 41a for obtaining the same effects. In this case, the write and read inhibition circuits 51 and 55 and decoded output inhibition circuit 43b constitute the inhibiting means 58 according to the invention.

As has been described in the foregoing, according to the invention, inhibiting means is provided, which functions to compare an address of a write inhibition area of an electrically rewritable non-volatile memory and an address from an external CPU and inhibits the writing of data in the area when the two compared addresses coincide and also functions to compare an address of a read inhibition area of the non-volatile memory and an address from an external reader/writer and inhibit the reading of data from the area when the two compared addresses coincide. It is thus possible to prevent erroneous rewriting of a program or protection-required data due to runaway of the CPU and also prevent reading of secret data by the third party, thus permitting realization of a microcomputer, in which a program memory and a data memory both consist of electrically rewritable memories, and which is very easy to use and has improved reliability and confidential property.

What is claimed is:

1. A semiconductor integrated circuit having selective memory write protection from CPU write requests and memory read protection from external reader/writer read requests, the CPU and the external reader/writer each having the capability of generating address information, read and write data, and read and write control signals, said circuit comprising:
   a non-volatile memory capable of electric rewriting;
   an address decoder for decoding an address from one of said external reader/writer and said CPU and thereby designating a memory cell of said non-volatile memory;
   an input/output buffer for inputting and outputting read/write data;
   a read/write control circuit for providing a write signal in response to a write request and a read signal in response to a read request from one of said external reader/writer and said CPU;
   a first input/output port for inputting and outputting read/write data and address data of said CPU;
   a second input/output port for inputting and outputting read/write data and address data of said external reader/writer; and
   inhibiting means for comparing a signal representative of a write inhibition area of said non-volatile memory and an address signal from said CPU and inhibiting the writing of data in said write inhibition area when the two compared signals coincide, and also comparing a signal representative of a read inhibition area of said non-volatile memory and an address signal from said external reader/writer and inhibiting the reading of data from said read inhibition area when the two compared signals coincide, said inhibiting means including:
   a write inhibition circuit for comparing upper bits of an address of a preset write inhibition area of said non-volatile memory and like upper bits of an address input from said CPU and providing an active write inhibition output when the compared bits coincide;
   an AND gate of negative logic for receiving said write inhibition output and a write signal of negative logic from said read/write control circuit and generating a write signal for controlling a write line of said non-volatile memory;
   a read inhibition circuit for comparing upper bits of an address of a preset read inhibition area of said non-volatile memory and like upper bits of an address input from said external reader/writer and providing an active read output when the compared bits coincide; and
   an AND gate of negative logic for receiving said read inhibition output and a read signal of negative logic from said read/write control circuit and generating a read signal for controlling the output state of read data of said input/output buffer.

2. The semiconductor integrated circuit according to claim 1, wherein said non-volatile memory capable of rewriting is an EEPROM.

3. A semiconductor integrated circuit having selective memory write protection from CPU write requests and memory read protection from external reader/writer read requests, the CPU and the external reader/writer each having the capability of generating address information, read and write data, and read and write control signals, said circuit comprising:
   a CPU and a peripheral circuit thereabout;
   a non-volatile memory capable of electric rewriting;
   an address decoder for decoding an address from one of said external reader/writer and said CPU and thereby designating a memory cell of said non-volatile memory;
   an input/output buffer for inputting and outputting read/write data;
   a read/write control circuit for providing a write signal in response to a write request and a read signal in response to a read request from one of said external reader/writer and said CPU;
   an input/output port for inputting and outputting read/write data and address data of said external reader/writer; and
   inhibiting means for comparing a signal representative of a write inhibition area of said non-volatile memory and an address signal from said CPU and inhibiting the writing of data in said write inhibition area when the two compared signals coincide, and also comparing a signal representative of a read inhibition area of said non-volatile memory and an address signal from said external reader/writer and inhibiting the reading of data from said read inhibition area when the two compared address coincide, said inhibiting means including:
   a write inhibition circuit for comparing upper bits of an address of a preset write inhibition area of said non-volatile memory and the like upper bits of an address input from said CPU and providing an active write inhibition output when the compared bits coincide;

an AND gate of negative logic for receiving said write inhibition output and a write signal of negative logic from said read/write control circuit and generating a write signal for controlling a write line of said non-volatile memory;

a read inhibition circuit for comparing upper bits of an address of a preset read inhibition area of said non-volatile memory and the like upper bits of an address input from said external reader/writer and providing an active read inhibition output when the compared bits coincide; and an AND gate of negative logic for receiving said read inhibition output and a read signal of negative logic from said read/write control circuit and generating a read signal for controlling the output state of read data of said input/output buffer.

4. The semiconductor integrated circuit according to claim 1 or 3, wherein functions of both a microcomputer program memory and a data memory are realized with the same memory structure, a program area and a protection-required data area are set as write inhibition areas, and a secret data area is set as a read inhibition area.

5. The semiconductor integrated circuit according to claim 3, wherein said non-volatile memory capable of rewriting is an EEPROM, said CPU and peripheral circuit thereof have a CMOS structure, and said EEPROM is a MNOS structure, and all these circuits are mounted on a single silicon chip.

6. The semiconductor integrated circuit according to claim 3 wherein the non-volatile memory is used to store both a microcomputer program and data; wherein said write inhibition area is used to protect said program and protection-required portions of said data; and wherein said read inhibition area is used to protect secret portions of said data.

7. A semiconductor integrated circuit having selective memory write protection from CPU write requests and memory read protection from external reader/writer read requests, the CPU and the external reader/writer each having the capability of generating address information, read and write data, and read and write control signals, said circuit comprising:

a non-volatile memory capable of electric rewriting;

an address decoder for decoding an address from one of said external reader/writer and said CPU and thereby designating a memory cell of said non-volatile memory;

an input/output buffer for inputting and outputting read/write data;

a read/write control circuit for providing a write signal in response to a write request and a read signal in response to a read request from one of said external reader/writer and said CPU;

a first input/output port for inputting and outputting read/write data and address data of said external CPU;

a second input/output port for inputting and outputting read/write data and address data of said external reader/writer; and inhibiting means for comparing a signal representative of a write inhibition area of said non-volatile memory and an address signal from said CPU and inhibiting the writing of data in said write inhibition area when the two compared signals coincide, and also comparing a signal representative of a read inhibition area of said non-volatile memory and an address signal from said external reader/writer and inhibiting the reading of data from said read inhibition area when the two compared signals coincide, said inhibiting means including:

a write inhibition circuit for comparing upper bits of an address of a preset write inhibition area of said non-volatile memory and the like upper bits of an address input from said CPU and providing an active write inhibition output when the compared bits coincide;

a read inhibition circuit for comparing upper bits of an address of a preset read inhibition area of said non-volatile memory and the like upper bits of an address input from said external reader/writer and providing an active read inhibition output when the compared bits coincide; and a decoded output inhibition circuit for inhibiting a decoded output of said address decoder according to said write inhibition output, a write signal from said read/write control circuit, said read inhibition output and a read signal from said read/write control circuit.

8. A semiconductor integrated circuit having selective memory write protection from CPU write requests and memory read protection from external reader/writer read requests, the CPU and the external reader/writer each having the capability of generating address information, read and write data, and read and write control signals, said circuit comprising:

a CPU and a peripheral circuit thereabout;

a non-volatile memory capable of electric rewriting;

an address decoder for decoding an address from one of said external reader/writer and said CPU and thereby designating a memory cell of said non-volatile memory;

an input/output buffer for inputting and outputting read/write data;

a read/write control circuit for providing a write signal in response to a write request and a read signal in response to a read request from one of said external reader/writer and said CPU;

an input/output port for inputting and outputting read/write data and address data of said external reader/writer; and inhibiting means for comparing a signal representative of a write inhibition area of said non-volatile memory and an address signal from said CPU and inhibiting the writing of data in said write inhibition area when the two compared signals coincide, and also comparing a signal representative of a read inhibition area of said non-volatile memory and an address signal from said external reader/writer and inhibiting the reading of data from said read inhibition area when the two compared signals coincide, said inhibiting means including:

a write inhibition circuit for comparing upper bits of an address of a preset write inhibition area of said non-volatile memory and the like upper bits of an address input from said CPU and providing an active write inhibition output when the compared bits coincide;

a read inhibition circuit for comparing upper bits of an address of a preset and inhibition area of said non-volatile memory and the like upper bits of an address input from said external reader/writer and providing an active read inhibition output when the compared bits coincide; and a decoded output inhibition circuit for inhibiting a decoded output of said address decoder according to said write inhibition output, a write signal from said read/write control circuit, said read inhibition output and a read signal from said read/write control circuit.

9. The semiconductor integrated circuit according to claim 1 or 7 wherein said write and read inhibition circuits each includes:

a latch type register having given bits for receiving a write signal for controlling a selection line from said address decoder and a write line of said non-volatile memory and a present data input from a data input/output port; and a coincidence detection circuit for comparing upper bits of an address input from one of said CPU and said external reader/writer and like output bits of said latch type register and providing an active inhibition output when the compared bits coincide;

each said coincidence detection circuit including:

an exclusive OR gate for receiving corresponding bits from said address input and the output of said latch type register; and a NOR gate for receiving the output of said exclusive OR gate and providing an inhibition output.

10. The semiconductor integrated circuit according to claim 3 or 8 wherein said write inhibition circuit and said read inhibition circuit each includes:

a latch type register having given bits for receiving a write signal for controlling a selection line from said address decoder and a write line of said non-volatile memory and a preset data input from a data input/output port; and a coincidence detection circuit for comparing upper bits of an address input from one of said CPU and said external reader/writer and like output bits of said latch type register and providing an active inhibition output when the compared bits coincide;

each said coincidence detection circuit including:

an exclusive OR gate for receiving corresponding bits from said address input and the output of said latch type register; and a NOR gate for receiving the output of said exclusive OR gate and providing an inhibition output.

11. The semiconductor integrated circuit according to claim 7 or 8, wherein said decoded output inhibition circuit includes:

a NAND gate for receiving said write inhibition output and a write signal of negative logic from said read/write control circuit;

a NAND gate for receiving said read inhibition output and a read signal of negative logic from said read/write control circuit;

an OR gate for receiving the output of each of said NAND gates; and an array of AND gates for receiving the output of said address decoder and the output of said OR gate, the outputs of said AND gates being supplied to corresponding memory cell selection lines.

* * * * *

UNITED STATES PATENT AND TRADEMARK OFFICE
CERTIFICATE OF CORRECTION

PATENT NO. : 5,097,445
DATED : March 17, 1992
INVENTOR(S) : Naoki Yamachi, et al It is certified that error appears in the above-indentified patent and that said Letters Patent is hereby corrected as shown below:

Col. 2, line 21, "an" should be --the--.

Col. 2, line 34, "secrete" should be --secret--.

Col. 5, line 13, "41a" should be --42a--.

Col. 6, line 6, "area" should be --are--.
Col. 6, line 7, insert --data-- after "hence".
Col. 6, line 12, "calibration" should be --inhibition--.

UNITED STATES PATENT AND TRADEMARK OFFICE
CERTIFICATE OF CORRECTION

PATENT NO. : 5,097,445
DATED : March 17, 1992
INVENTOR(S) : Naoki Yamauchi, et al It is certified that error appears in the above-indentified patent and that said Letters Patent is hereby corrected as shown below:

Col. 7, line 13, "NAND" should be --AND--.

Col. 8, line 68, delete "the".

Col. 9, line 11 and Col. 10, lines 9, 15, 61, 67, delete "the".

Col. 11, line 16, "Present" should be --preset--.

Col. 10, line 66, "and" should be --read--.

Signed and Sealed this

Fourteenth Day of September, 1993

*Attest:*

BRUCE LEHMAN

*Attesting Officer*  *Commissioner of Patents and Trademarks*